(12) United States Patent
Kawasumi

(10) Patent No.: US 6,233,266 B1
(45) Date of Patent: May 15, 2001

(54) LIGHT EMITTING DEVICE

(75) Inventor: Takayuki Kawasumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/010,840

(22) Filed: Jan. 22, 1998

(30) Foreign Application Priority Data

Jan. 22, 1997 (JP) .................................................. 9-009638

(51) Int. Cl.[7] .................................................. H01S 5/34
(52) U.S. Cl. .................. 372/46; 372/45; 257/13; 257/14; 257/103
(58) Field of Search .................. 372/45, 46; 257/13, 257/14, 96, 103

(56) References Cited

U.S. PATENT DOCUMENTS

| | | | |
|---|---|---|---|
| 5,956,359 | * | 9/1999 | Adams et al. .......................... 372/45 |
| 5,995,528 | * | 11/1999 | Fukunaga et al. ...................... 372/45 |
| 6,028,874 | * | 2/2000 | Wada et al. ............................. 372/45 |

* cited by examiner

*Primary Examiner*—James W. Davie
(74) *Attorney, Agent, or Firm*—Ronald P. Kananen; Rader, Fishman & Grauer

(57) ABSTRACT

A high-reliability light emitting device can be provided by suppressing deterioration of an active layer resulting from diffusion of an introduced impurity. A light emitting device according to the present invention includes a layer (9) having lattice mismatching provided between an active layer (15) and a layer (10) into which an impurity is introduced.

11 Claims, 5 Drawing Sheets

1

LIGHT EMITTING DEVICE

BACKGROUND OF THE INVENTION

1. Field of the Invention

The present invention relates to a light emitting device, such as a semiconductor laser, a light-emitting diode or the like, having an active layer and a layer subjected to impurity injection.

2. Description of the Related Art

In a current-injection type light emitting device such as a semiconductor laser, a light emitting diode or the like, in order to improve a current introduction efficiency and a light emission efficiency, a pn junction position and a position of an active layer are preferably set closer to each other. For the same reason, it is preferable to increase concentration of the introduced impurity to a higher level.

However, when impurities of a certain kind are injected into the active layer, the active layer is considerably rapidly deteriorated. Therefore, there are usually employed some countermeasures therefor such as a process of lowering a concentration of the injected impurity in the vicinity of the active layer, a process of separating impurities from the active layer by setting the vicinity of the active layer as a non-doped layer, or the like.

As described above, a doping profile in the vicinity of the active layer is a very important factor which influences reliability of the light emitting device.

Especially, when a III-V compound semiconductor such as GaAs, GaInP or the like is doped with zinc, zinc is very easily diffused and hence easily enters the vicinity of the active layer during crystal growth at a high temperature, which leads to deterioration of the light emitting device (see Endo et al.: Appl. Phys. Lett. 64(1994), p146).

Specifically, if an impurity diffusion region is too close to the active layer, then a lifetime of the light emitting device is lowered, and thereby its reliability is lowered. If, on the other hand, the impurity diffusion region is too far from the active layer, then the position of the impurity diffusion region is displaced relative to the pn junction.

Therefore, although the condition of the introduction of the impurity is an important factor in the light emitting device, it is difficult to control the diffusion of the introduced impurity such as zinc or the like, which considerably lowers a degree of freedom in the doping profile.

SUMMARY OF THE INVENTION

It is therefore an object of the present invention to provide a high-reliability light emitting device by suppressing deterioration of an active layer resulting from diffusion of an introduced impurity.

According to a first aspect of the present invention, a light emitting device includes a layer having lattice mismatching provided between an active layer and a layer into which an impurity is introduced.

According to a second aspect of the present invention, an optical device includes a substrate, a first cladding layer formed on the substrate, an active layer formed on the first cladding layer, a non-doped second cladding layer formed on the active layer, a lattice-mismatched layer formed on the second cladding layer, and a doped third cladding layer formed on the lattice-mismatched layer.

According to the arrangement of the present invention, since the layer having the lattice mismatching is provided, the layer having the lattice mismatching suppresses diffusion of an introduced impurity. Therefore, it is possible to suppress diffusion of the introduced impurity to an active layer beyond the layer having the lattice mismatching, and hence it is possible to suppress deterioration of the active layer and to consequently increase a lifetime of the light emitting device.

DESCRIPTION OF THE PREFERRED EMBODIMENT

A concept of the present invention will be described before description of a light emitting device according to an embodiment of the present invention.

A light emitting device according to the present invention is formed by forming a layer having lattice mismatching (i.e., a so-called strained layer) between an active layer and a layer into which an impurity is introduced.

In this embodiment, the concept of the present invention will be described by employing an example of doping a III-V compound semiconductor such as GaAs, GaInP or the like with zinc (Zn).

In this case, zinc enters a site of group III and becomes an acceptor, and then a part of introduced zinc becomes an interstitial atom. Zinc is easily diffused in a semiconductor, and this diffusion is caused mainly by interstitial zinc atoms.

When a current-injection type semiconductor light emitting device, such as a semiconductor laser, a light emitting diode or the like, is manufactured, introduction of zinc into an active layer remarkably lowers reliability of the semiconductor light emitting device. Therefore, the doping of zinc is carried out from or up to a position slightly away from the active layer.

However, zinc atoms mainly located between lattices in the direction of the active layer are diffused in a high-temperature state during a crystal growth.

Usually, each of layers forming the light emitting device is manufactured under a substantially lattice-matched condition.

If a layer having lattice mismatching is provided between the active layer and a layer into which impurity is introduced (hereinafter referred to as a doped layer), then movement of an introduced impurity such as zinc or the like becomes different.

Figure 1:
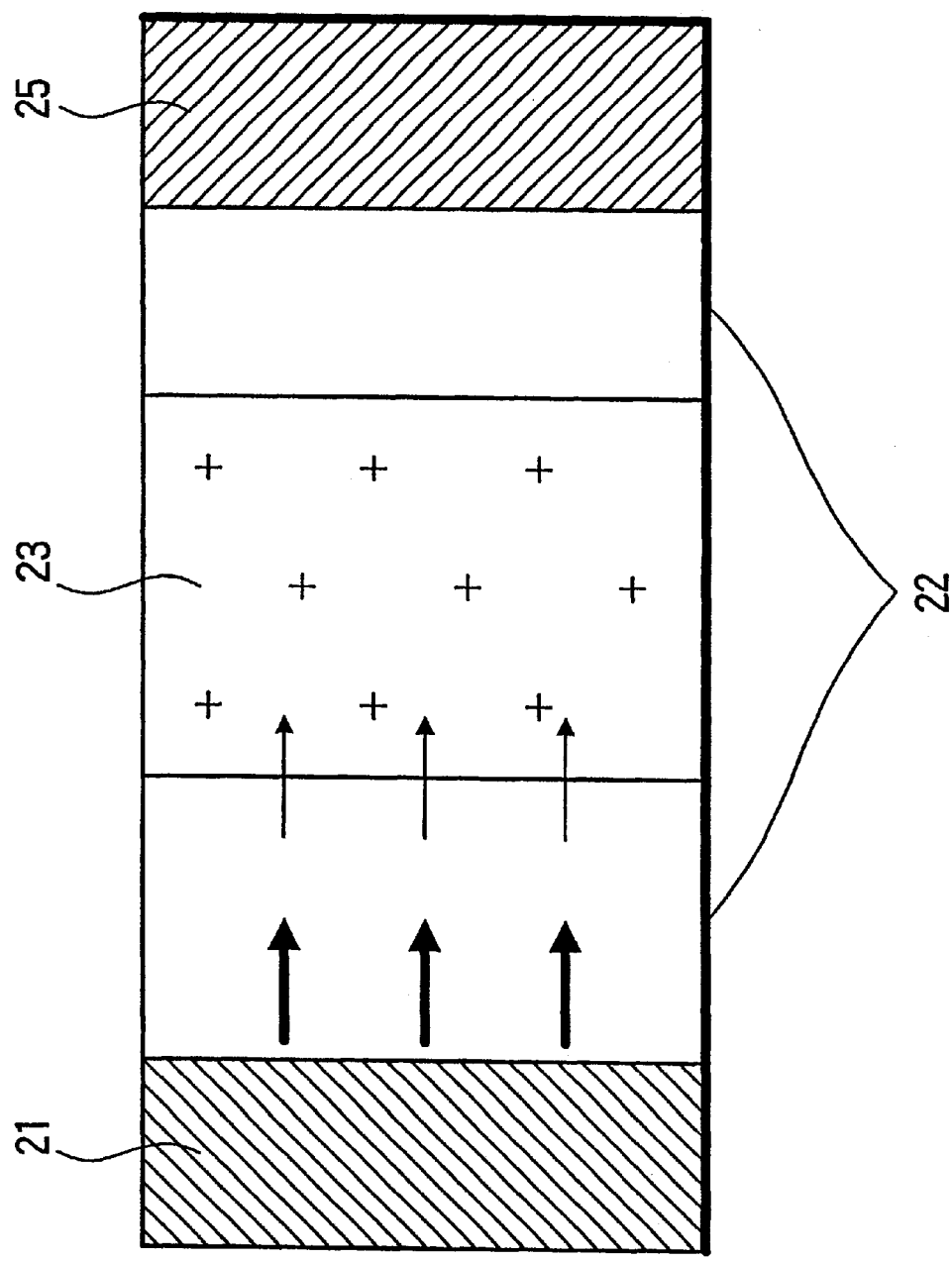
FIG. 1 is a diagram used to explain movement of zinc atoms in a light emitting device employing only a compression-strained layer.

For example, in a layer having a large lattice constant and resultant compression strain, existence of interstitial zinc atoms becomes unstable. Therefore, as shown in FIG. 1, zinc introduced into a doped layer 21 is easily diffused to a lattice matched layer 22, but it is difficult for an interstitial zinc atom to move from the lattice matched layer 22 to a compression-strained layer 23. Therefore, an amount of zinc which reaches an active layer 25 is suppressed.

In FIG. 1, an arrow represents movement of zinc, and a bolder arrow represents easier movement thereof. Study of FIG. 1 reveals that the compression-strained layer 23 has an effect of suppressing the movement of zinc.

Figure 2:
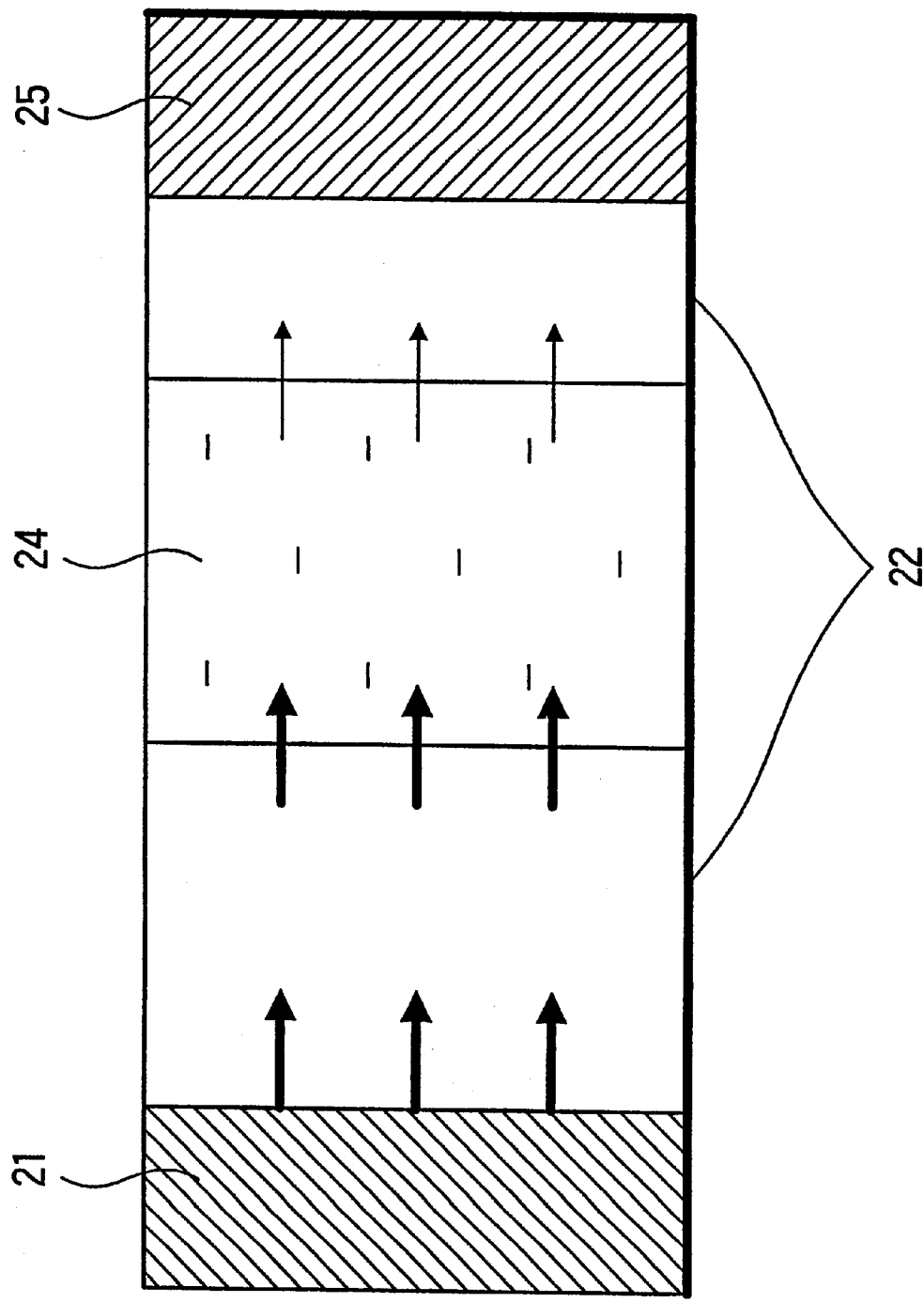
FIG. 2 is a diagram used to explain the movement of the zinc atoms in a light emitting device employing only a tension-strained layer.

Contrary, in a layer having a small lattice constant and a resultant tension strain, existence of an interstitial atom becomes more stable as compared with that in a lattice-matched layer. As shown in FIG. 2, while the interstitial atom is easily moved from the lattice-matched layer 22 to a tension-strained layer 24, the movement of zinc from the tension-strained layer 24 to the lattice matched layer 22 is suppressed. Therefore, an interstitial atom is trapped by the tension-strained layer 24, and also in this case, consequently the movement of zinc to the active layer 25 is suppressed.

As described above, if the layer 23 or 24 having lattice strain is provided in the lattice-matched layer 22, each of the compression-strained layer 23 and the tension-strained layer 24 serves to suppress the movement of the interstitial atom.

Although an effect of suppressing movement of an introduced impurity is more suppressed as an amount of strain is large or a layer having stain is thick, a thickness of the layer having strain must be set to a critical film thickness or smaller in order to maintain a crystal quality.

Therefore, if a strained layer is formed of a single layer formed of the compression-strained layer 23 or the tension-strained layer 24, sometimes a sufficient effect cannot be achieved.

If a lamination structure employing both of the tension-strained layer 23 and the compression-strained layer 24 is employed, then it is possible to set a substantial critical film thickness larger by compensating respective strains in the layers 23, 24, which can lead to improvement of the effect of suppressing the movement of the interstitial atom.

Figure 3:
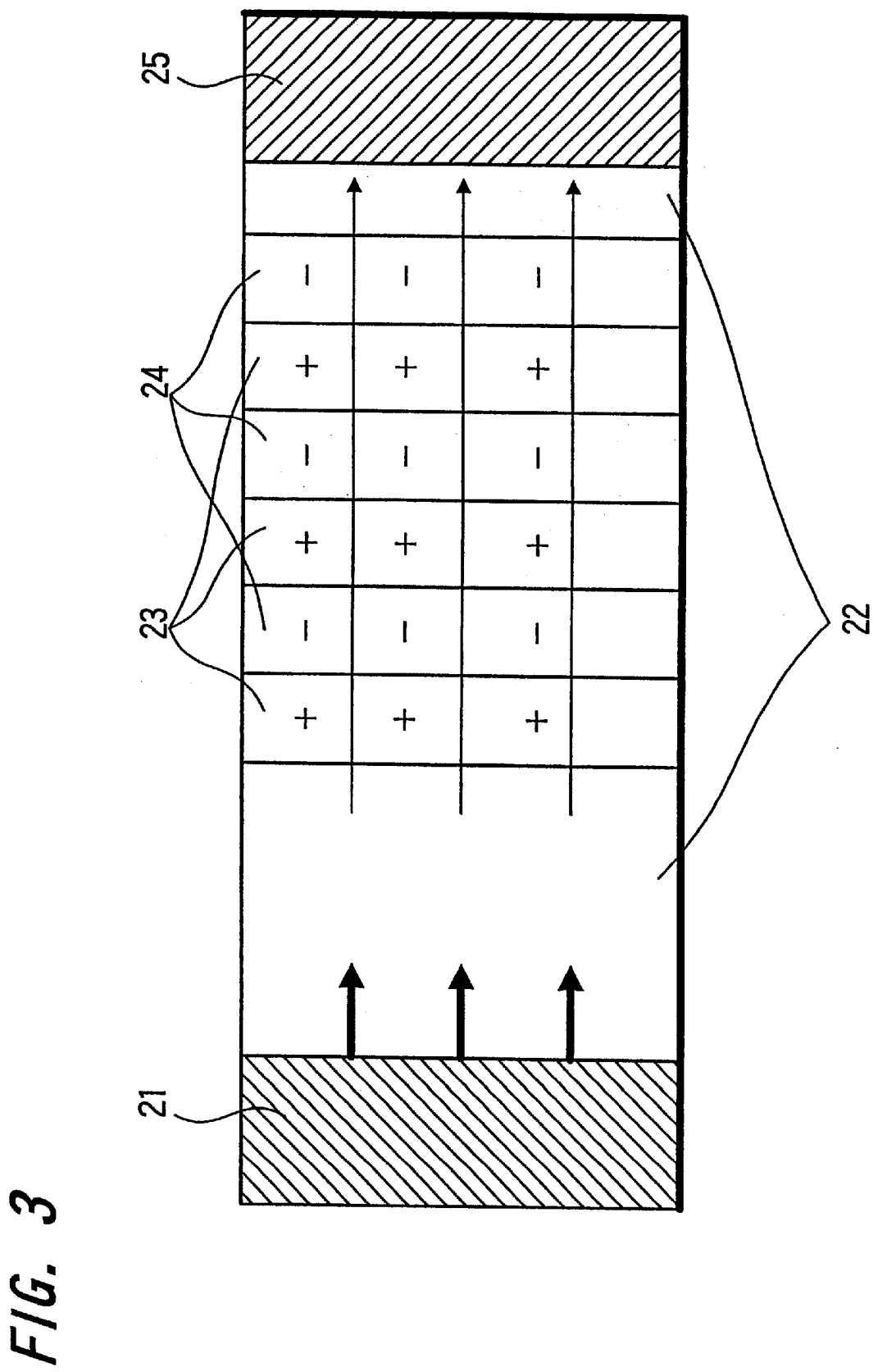
FIG. 3 is a diagram used to explain movement of the zinc atoms in a light emitting device employing both the tension-strained layer and the compression-strained layer.

For example, as shown in FIG. 3, the above effect can be realized by employing a lamination structure in which the tension-strained layer 23 and the compression-strained layer 24 are alternately laminated.

A light emitting device according to the embodiment of the present invention will hereinafter be described in detail with reference to the accompanying drawings.

Figure 4:
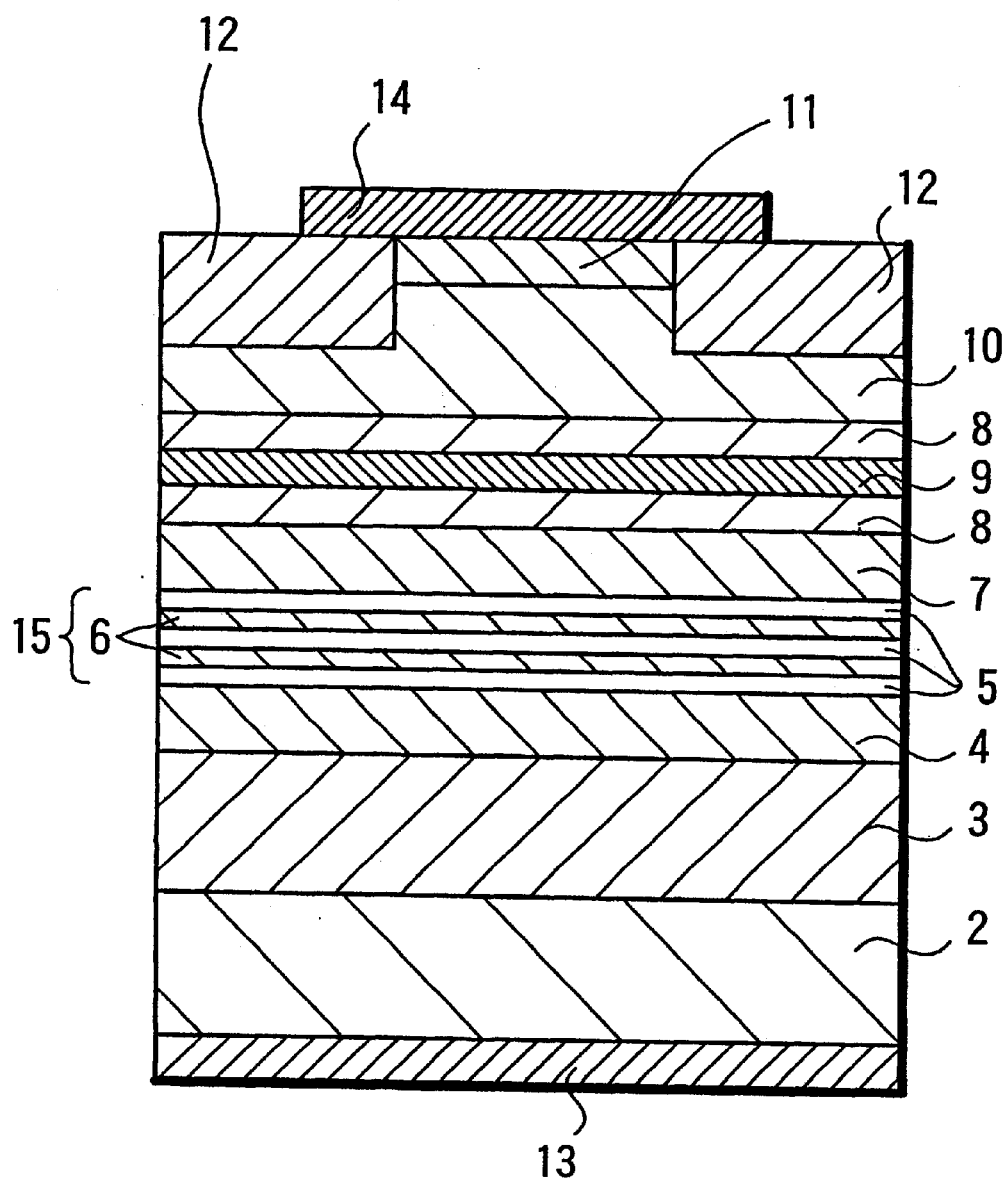
FIG. 4 is a schematically structural cross-sectional view of a semiconductor laser to which a light emitting device according to an embodiment of the present invention is applied.

FIG. 4 is a cross-sectional view of the light emitting device according to the embodiment of the present invention, i.e., a light emitting device according to the present invention which is applied to an AlGaInP system semiconductor laser.

As shown in FIG. 4, a semiconductor laser 1 has a so-called separate confinement heterostructure (SCH) in which a layer used for optical wave guiding and an active layer are separately provided.

The semiconductor laser 1 has a semiconductor substrate 2 made of GaAs doped with a first conductive type, e.g., n-type silicon, a first conductive type cladding layer 3 made of AlGaInP doped with Se, for example, formed on the semiconductor substrate 2, and a first guide layer 4 made of AlGaInP formed on the first conductive type cladding layer 3.

The semiconductor layer further has a well layer 5 made of GaInP, for example, formed on the first guide layer 4 and a barrier layer 6 made of AlGaInP, for example, formed thereon which are alternately laminated and hence form an active layer 15 having a quantum well structure.

The semiconductor laser 1 has a second guide layer 7 made of AlGaInP, for example, formed on the active layer 15, an undoped cladding layer 8 made of AlGaInP, for example, formed on the second guide layer 7, a diffusion preventing layer 9 having lattice mismatching formed on the undoped cladding layer 8, and further the undoped cladding layer 8 formed on the diffusion preventing layer 9 so as to sandwich the diffusion preventing layer 9.

The semiconductor laser 1 has a second conductive-type (p-type) zinc-doped cladding layer 10 made of AlGaInP doped with zinc, for example, formed on the undoped cladding layer 8, and a contact layer 11 made of GaAs doped with zinc formed on the cladding layer 10.

The semiconductor laser 1 has, in order to form a stripe structure for current confinement, a current confinement layer 12 into which a first conductive type (n-type) impurity such as boron or the like is introduced and which is formed on each of outer sides of the stripe structure.

Moreover, the semiconductor laser 1 has a first conductive type (n-type) electrode 13 formed under the semiconductor substrate 2 and a second conductive type (p-type) electrode 14 formed on the contact layer 11.

Figure 5:
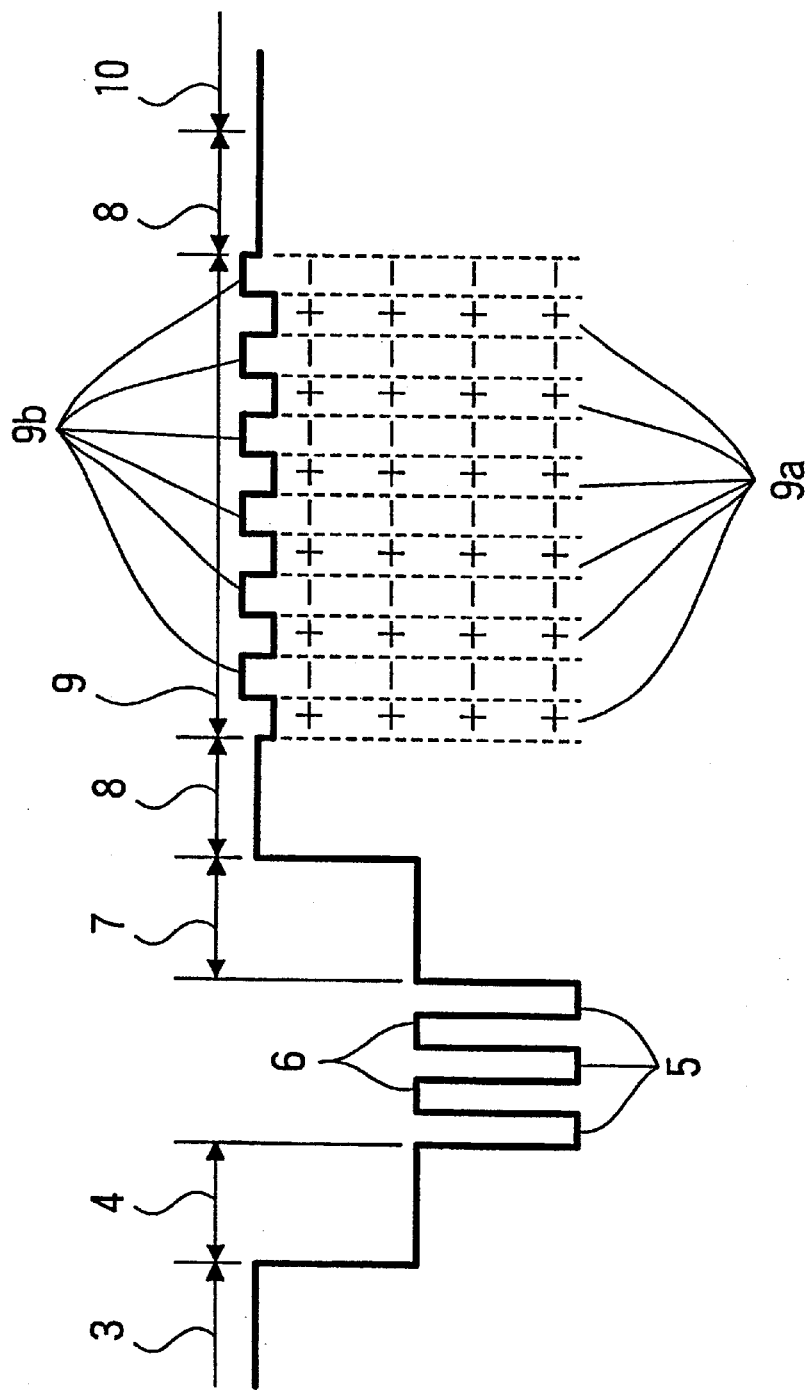
FIG. 5 is a diagram showing an energy band in the vicinity of an active layer of the semiconductor layer shown in FIG. 4.

In this embodiment, as shown in FIG. 5 which is a diagram showing an energy band in the vicinity of the active layer, the diffusion preventing layer 9 having lattice mismatching is formed of a structure in which a compression-strained layer 9a and a tension-strained layer 9b are alternately laminated.

In this structure, the diffusion preventing layer 9 suppresses diffusion of doped zinc in the second conductive type cladding layer 10.

Therefore, since the diffusion of an interstitial zinc atom to the active layer 15 can be suppressed, it is possible to suppress deterioration of the active layer 15 and to consequently increase a lifetime of the semiconductor laser 1, which can lead to improvement of the reliability of the semiconductor laser 1.

Thus, it is possible to increase the degree of freedom in a doping profile of zinc regardless of diffusion of zinc to the active layer 15.

The semiconductor laser 1 is manufactured as follows.

When each of the layers is formed on the substrate by crystal growth, a metal organic chemical vapor deposition (MOCVD), for example, is employed in which organic metal raw materials such as trimethylgallium (TMGa), trimethylaluminium (TMAl), trimethylindium (TMIn) and dimethylzinc (DMZn) and hydride gas such as $AsH_3$, $PH_3$ and $H_2Se$ are employed. The crystal growth carried out under the condition that a growth temperature is 700° C. and a pressure in a growth chamber is 200 torr. $H_2$, for example, is employed as a carrier gas.

Initially, the first conductive type cladding layer 3 having a thickness of about 1 μm and made of $(Al_{0.7}Ga_{0.3})_{0.5}In_{0.5}P$ or the like doped with Se is formed on the semiconductor substrate 2 made of GaAs doped with silicon having a <100> plane inclined at an angle of 8° in the <110> direction, for example. Further, the first guide layer 4 having a thickness of about 50 nm and made of $(Al_{0.5}Ga_{0.5})_{0.5}In_{0.5}P$ or the like is laminated on the cladding layer 3.

The well layer 5 having a thickness of about 5 nm and made of $Ga_{0.5}In_{0.5}P$ or the like and the barrier layer 6 having a thickness of about 6 nm and made of $(Al_{0.5}Ga_{0.5})_{0.5}In_{0.5}P$ or the like are alternately laminated on the first guide layer 4, thereby the active layer 15 having a three quantum well structure, for example, is formed.

Subsequently, the second guide layer 7 having a thickness of about 5 nm and made of $Ga_{0.5}In_{0.5}P$ or the like is formed on the active layer 15, and the undoped cladding layer 8 having a thickness of about 200 nm and made of $(Al_{0.7}Ga_{0.3})_{0.5}In_{0.5}P$ or the like is formed on the second guide layer 7.

The diffusion preventing layer 9 is subsequently formed on the undoped cladding layer 8.

The diffusion preventing layer 9 is formed of the lamination structure in which the tension-strained layer 9b made of $(Al_{0.7}Ga_{0.3})_{0.6}In_{0.4}P$ or the like and the compression-strained layer 9a made of $(Al_{0.7}Ga_{0.3})_{0.4}In_{0.6}P$ or the like are laminated alternately, e.g, the ten tension-strained layers 9b and the ten compression-strained layer 9a are alternately laminated.

As described above, in the AlGaInP system, if an amount of In is reduced from that in the lattice matching condition, then the layer of AlGaInP system becomes the tension-strained layer. If on the other hand the amount of In is increased therefrom, then the layer becomes the compression-strained layer.

The undoped cladding layer 8 having a thickness of about 200 nm and made of $(Al_{0.7}Ga_{0.3})_{0.5}In_{0.5}P$ or the like is formed on the diffusion preventing layer 9, and then the second conductive type cladding layer 10 having a thickness of about 600 nm and made of $(Al_{0.7}Ga_{0.3})_{0.5}In_{0.5}P$ or the like is formed on the undoped cladding layer 8. The contact layer 11 having a thickness of about 300 nm and made of zinc-doped GaAs or the like is laminated on the cladding layer 10.

Further, the first conductive type, e.g., n-type current confinement layer 12 is formed on each of outer sides by ion implantation of boron, thereby the stripe structure being formed at the center.

Then, the second conductive type (p-type) electrode 14 made of Ti/Pt/Au is formed so as to cover the stripe structure of the contact layer 11 by successively depositing Ti having a thickness of about 50 nm, Pt having a thickness of about 100 nm, and Au having a thickness of 200 nm by evaporation.

As described above, the semiconductor laser 1 having the structure shown in FIG. 4 can be manufactured.

While in this embodiment the present invention is applied to the semiconductor laser of AlGaInP system, the present invention is not limited thereto. Even when the present invention is applied to semiconductor lasers employing other raw materials and/or having other structures or light emitting diodes, it is possible to prevent the diffusion of introduced impurities to an active layer by forming the layer having the lattice mismatching as the diffusion preventing layer.

While in this embodiment the introduced impurity is zinc, the present invention is not limited thereto and other introduced impurities may be employed.

According to the light emitting device of the present invention, since the diffusion of the interstitial atoms of the impurity to the active layer can be suppressed, it is possible to suppress the deterioration of the active layer and to consequently increase the lifetime of the light emitting device, which leads to improvement of the reliability of the light emitting device.

Moreover, this effect can increase the degree of the doping profile regardless of diffusion of a dopant to the active layer.

If the layer having the lattice mismatching is formed by employing both of the tension-strained layer and the compression-strained layer, it is possible to increase the substantial critical film thickness of the layer having the lattice mismatching, which can improve the effect of suppressing the diffusion of the impurity.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. An optical device comprising:
   a substrate;
   a first cladding layer formed on said substrate;
   an active layer formed on said first cladding layer;
   a non-doped second cladding layer formed on said active layer;
   a lattice-mismatched layer formed on said second cladding layer; and
   a doped third cladding layer formed on said lattice-mismatched layer.

2. An optical device according to claim 1, further comprising:
   a non-doped layer provided between said lattice-mismatched layer and said doped third cladding layer.

3. A light emitting device comprising:
   a substrate;
   a doped first cladding layer formed on said substrate;
   a first lattice-mismatching layer formed on said first cladding layer;
   a non-doped second cladding layer formed on said first lattice-mismatching layer;
   an active layer formed on said second cladding layer; and
   a third cladding layer formed on said active layer.

4. A light emitting device according to claim 3, further comprising:
   a non-doped layer provided between said lattice-mismatching layer and said doped first cladding layer.

5. A light emitting device according to claim 3, further comprising:
   a second lattice-mismatching layer formed on said third cladding layer; and
   a doped fourth cladding layer formed on said second lattice-mismatching layer,
   wherein said third cladding layer is a non-doped layer.

6. A light emitting device comprising:
   a semiconductor substrate doped with a first conductive type;
   a first conductive type cladding layer formed on the semiconductor substrate;
   a first guide layer formed on the first conductive type cladding layer;
   an active layer formed on the first guide layer;
   a second guide layer formed on the active layer;
   an undoped cladding layer formed on the second guide layer;
   a diffusion preventing layer having lattice mismatching formed on the undoped cladding layer;
   a second undoped cladding layer formed on the diffusion preventing layer so as to sandwich the diffusion preventing layer; and
   a second doped cladding layer formed on the undoped cladding layer.

7. The light emitting device as set forth in claim 6 further including
   a doped contact layer formed on the second doped cladding layer.

8. The light emitting device as set forth in claim 7, further including a current confinement layer into which a first conductive type impurity is introduced.

9. The light emitting device as set forth in claim 8, further including a first conductive type electrode formed under the semiconductor substrate and a second conductive type electrode formed on the contact layer.

10. The light emitting device as set forth in claim 6, wherein said semiconductor substrate is made of GaAs, said first conductive cladding layer is made of AlGaInP doped with Se, and said first guide layer is made of AlGaInP.

11. The light emitting device as set forth in claim 6, wherein said active layer comprises a well layer formed on the first guide layer and a barrier layer formed thereon, said active layer having a quantum well structure.

* * * * *